United States Patent
Frommeyer et al.

(10) Patent No.: US 7,448,763 B2
(45) Date of Patent: Nov. 11, 2008

(54) OPTICAL SUBASSEMBLY AND PROJECTION OBJECTIVE IN SEMICONDUCTOR LITHOGRAPHY

(75) Inventors: Andreas Frommeyer, Aalen (DE); G Fraser Morrison, Aalen (DE); Wolfgang Keller, Erbach (DE); Yim-Bun Patrick Kwan, Aalen (DE); Harald Kirchner, Munich (DE); Willi Heintel, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 181 days.

(21) Appl. No.: 10/573,216

(22) PCT Filed: Dec. 3, 2003

(86) PCT No.: PCT/EP03/13606

§ 371 (c)(1),
(2), (4) Date: Mar. 24, 2006

(87) PCT Pub. No.: WO2005/040926

PCT Pub. Date: May 6, 2005

(65) Prior Publication Data

US 2007/0014037 A1    Jan. 18, 2007

(30) Foreign Application Priority Data

Oct. 2, 2003    (DE) ................ 103 46 046

(51) Int. Cl.
*G02B 5/08* (2006.01)
*G02B 7/02* (2006.01)

(52) U.S. Cl. ............. 359/848; 359/846; 359/811; 359/813; 359/819; 359/820; 359/822

(58) Field of Classification Search ........... 359/811, 359/813, 818–820, 822, 846–849, 861–865, 359/871, 872; 353/100, 101; 356/614; 396/529; 355/30; 250/216

See application file for complete search history.

(56) References Cited

U.S. PATENT DOCUMENTS

| | | | | |
|---|---|---|---|---|
| 4,037,944 A | * | 7/1977 | Hanson | 359/848 |
| 4,147,413 A | * | 4/1979 | Sims et al. | 359/820 |
| 4,268,123 A | * | 5/1981 | Mesco | 248/488 |
| 4,540,251 A | * | 9/1985 | Yau et al. | 359/846 |
| 4,681,408 A | * | 7/1987 | Ahmad et al. | 359/848 |
| 4,726,671 A | * | 2/1988 | Ahmad et al. | 359/848 |
| 4,733,945 A | * | 3/1988 | Bacich | 359/820 |
| 4,822,155 A | * | 4/1989 | Waddell | 359/847 |
| 4,929,073 A | * | 5/1990 | La Plante et al. | 359/848 |
| 5,249,082 A | * | 9/1993 | Newman | 359/813 |
| 5,488,514 A | | 1/1996 | Bruning et al. | 359/811 |

(Continued)

FOREIGN PATENT DOCUMENTS

EP    0230277 A2    7/1987

(Continued)

*Primary Examiner*—Loha Ben
(74) *Attorney, Agent, or Firm*—GrayRobinson, P.A.

(57) ABSTRACT

An optical subassembly with an optical element, for example a mirror element (7), has an optical surface (9) and bearing points (12) arranged on the circumference. The optical element (7) is connected to a mount (13) at the bearing points (12) via connecting elements (14, 15, 16, 17, 18). Stress-decoupling cutouts, for example curved slots (11), are provided between the optical surface (9) and the bearing points (12).

29 Claims, 2 Drawing Sheets

U.S. PATENT DOCUMENTS

| | | | | |
|---|---|---|---|---|
| 5,986,827 A * | 11/1999 | Hale | ......................... | 359/822 |
| 6,229,657 B1 | 5/2001 | Holderer et al. | ............. | 359/822 |
| 6,400,516 B1 * | 6/2002 | Spinali | ....................... | 359/819 |
| 6,859,337 B2 * | 2/2005 | Oshino et al. | ............... | 359/819 |
| 6,870,632 B2 | 3/2005 | Petasch et al. | .............. | 356/614 |
| 2003/0010902 A1 | 1/2003 | Hof et al. | ................... | 250/216 |

FOREIGN PATENT DOCUMENTS

| | | |
|---|---|---|
| EP | 1137054 A1 | 9/2001 |
| EP | 1168028 A1 | 1/2002 |
| EP | 1253601 A2 | 10/2002 |
| EP | 1312965 A1 | 5/2003 |
| JP | 08005807 | 1/1996 |

* cited by examiner

OPTICAL SUBASSEMBLY AND PROJECTION OBJECTIVE IN SEMICONDUCTOR LITHOGRAPHY

CROSS REFERENCE TO RELATED APPLICATIONS

This application is a U.S. National Phase entry under 35 U.S.C. § 371 of International Application Number PCT/EP2003/013606, which designated the U.S. and at least one country other than the U.S., and claims priority thereto under 35 U.S.C. §§365(a) and 120 and under 35 U.S.C. §§365 (a) and (b) and 119 and claims priority under 35 U.S.C. §119 to German Patent Application Number DE 103 46 046.2 filed Dec. 3, 2003.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

BACKGROUND OF THE INVENTION

1. Field of the Invention

The invention relates to an optical subassembly and a projection objective in semiconductor lithography having at least one optical subassembly.

2. Description of Related Art

An optical subassembly of the type mentioned at the beginning and a projection objective having an optical subassembly with an optical element which has bearing points arranged on the circumference and is connected to a mount via resilient connecting elements is disclosed by WO 02/16993 A1.

Stress-decoupled connection of an optical element to a mount in a projection objective of a projection illumination system for producing semiconductor elements is also disclosed by DE 198 25 716 A1.

EP 1 137 054 A1 likewise shows a projection objective in semiconductor lithography with connecting elements between an optical element and a mount, a wafer device having three bearing points on the circumference, each having two adjustable individual feet.

For the further prior art, reference is made to EP 1 245 982 A2.

Optically reflective EUV systems in projection illumination systems with a projection objective in semiconductor lithography have to satisfy extremely high requirements with respect to accuracy, in particular with respect to dynamic stability, temperature influences and long-term behavior. Extremely small external effects on the optical subassemblies cause very large disruptive influences on the optical surface contours.

Particular problems result with respect to the mounting of optical subassemblies and also of individual optical elements which, on the one hand, are to be decoupled as far as possible from external influences, such as mechanical forces and thermal stresses arising from different thermal expansion coefficients, but, on the other hand, should be mounted rigidly. For example, optical subassemblies or even individual optical elements are positioned or adjusted via actuators, the intention being to avoid their adjusting forces having effects on the optical surface. This applies in particular to mirror elements and lenses.

From time to time, it is also necessary to remove and install optical elements some times, the intention being to provide reproducibility of the positioning. In this case, installation positions are especially a problem, the optical axis of an optical element deviating from the horizontal or from the vertical axial position. In this case, tilting forces also occur in addition to the forces due to the weight.

BRIEF SUMMARY OF THE INVENTION

The present invention is therefore based on the object, in the case of an optical subassembly, to provide a mounting and a connection to mount elements which eliminates the problems mentioned at the beginning, in particular by means of which external influences on the optical subassembly and/or an optical element of the subassembly are minimized as far as possible.

According to the invention, this object is achieved by stress-decoupling cutouts being arranged between the optical surface and the bearing points.

As a result of the cutouts according to the invention, both thermal and mechanical stresses and loadings, such as vibrations or deformation forces, from the outside are as far as possible kept away from the optical element. This applies both during transport and during operation. By means of this interposition of cutouts, preferably in the form of slots, physical separation between the bearing points and the optical surface of the optical element is achieved. In this way, the connecting area between these two parts is reduced to a minimum, care merely having to be taken that there is sufficient stability or stiffness and that the dynamic requirements continue to be satisfied.

In one possible refinement, the slots can have a curved shape which, in its course, is matched at least approximately to the external course of the optical surface. In this way, the connecting area is reduced to a minimal transition area with a low space requirement, at the same time there being sufficient clearance to be able to absorb different expansions between the optical element and the mount. At the same time, sufficient stiffness between the bearing points and the optical element can be maintained and the area in which heat transfer between the aforementioned parts is possible is likewise considerably reduced.

If a mirror element is provided as the optical element, then, in a very advantageous refinement of the invention, the mirror part can be formed in one piece with an optical surface and a base part.

In this case, use will advantageously be made of a material which has a very low thermal transfer coefficient, such as quartz glass, Zerodur® (glass ceramic from Schott Glas), or ULE® (ultra low expansion glass from Corning). The use of a single-piece configuration not only provides good dynamic properties, in particular with regard to a high natural frequency, but also, moreover, long-term stability, since the number of connections between different constituent parts of the optical element is reduced to a minimum.

In an advantageous development of the invention, provision can be made for connecting elements to be employed whose clamping forces can be adjusted. For this purpose, for example, clamping elements can be provided which connect the bearing points to the mount with a force fit. In this case, the clamping elements can in each case be connected to the mount by screw connections, it being possible for spring elements to be provided for a preselected preclamping force.

If the optical element has to be removed and then installed again some times for repair purposes or else for precise adjustment or production of its optical surface, it is necessary to create reproducible fixing and bearing conditions. This applies in particular with respect to the bearing points with the connecting elements to the mount. Here, if possible, constant absorption of force or transmission of force should always be maintained, in order that their effects on the optical element or its optical surface remain the same. With the configuration according to the invention of the clamping elements, this can be achieved to the greatest extent.

A further advantageous refinement can consist in three bearing points being arranged distributed on the circumference of the optical element, each bearing point being connected to the mount via at least one connecting joint.

By means of this refinement, isostatic mounting of the optical element is achieved.

In this case, provision can advantageously be made for the at least one connecting joint to be designed to be stiff in two directions; this stiff design should in particular be provided in the tangential direction and in the axial direction.

This refinement according to the invention achieves the situation where each bearing point, although, firstly, it can react optimally to thermal stresses and/or mechanical loadings and "intercept" these, secondly, as viewed overall, a highly stiff overall mounting for the optical element is achieved via the three bearing points with the aforementioned degrees of freedom.

The optical subassembly according to the invention can be used in the widest range of optical fields.

One very advantageous possible use consists in installing the optical subassembly in a projection objective in semiconductor lithography for producing semiconductor elements. In this field, extremely high accuracies of the optical imaging quality are needed.

A very advantageous mount technique results if provision is made for two bearing feet to be provided for each bearing point and, in particular, to be arranged in the form of a bipod. In this case, provision can be made for the connecting joints to be designed as solid-body joints with slots.

Configuring the connecting joints as solid-body joints permits a play-free, resiliently compliant connection with degrees of freedom in the desired directions—depending on the arrangement of slots in the solid-body joint—to be provided.

Advantageous developments and refinements of the invention emerge from the remaining subclaims.

BRIEF DESCRIPTION OF THE DRAWINGS

In the following text, an exemplary embodiment of the invention is illustrated in principle using the drawings, in which.

DETAILED DESCRIPTION OF A PREFERRED EMBODIMENT

Figure 1:
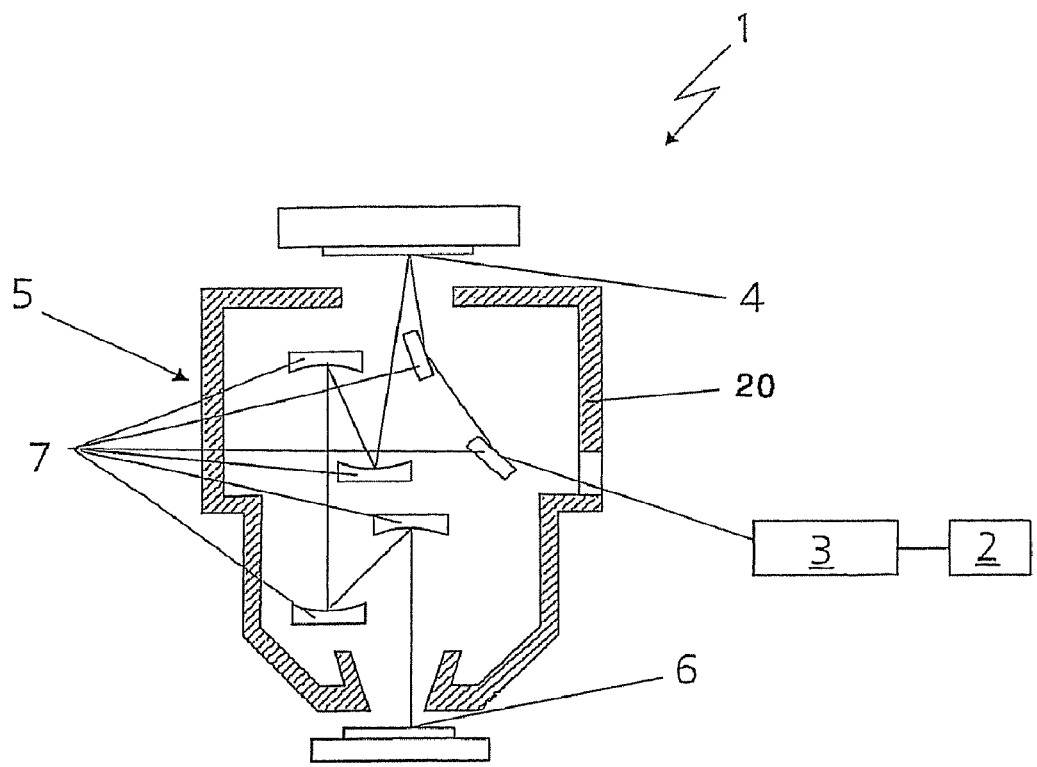
FIG. 1 shows a basic structure of an EUV projection illumination system having a light source, an illumination system and a projection objective.

As can be seen from FIG. 1, an EUV projection illumination system 1 has a light source 2, an EUV illumination system 3 for illuminating a field in a plane 4 in which a mask bearing a structure is arranged, and a projection objective 5 for forming the mask bearing the structure in the plane 4 on a light-sensitive substrate 6. The projection objective 5 has a plurality of optical elements, in particular mirrors 7, in its housing 20. An EUV projection illumination system 1 of this type is disclosed by EP 1 278 089 A2.

Figure 2:
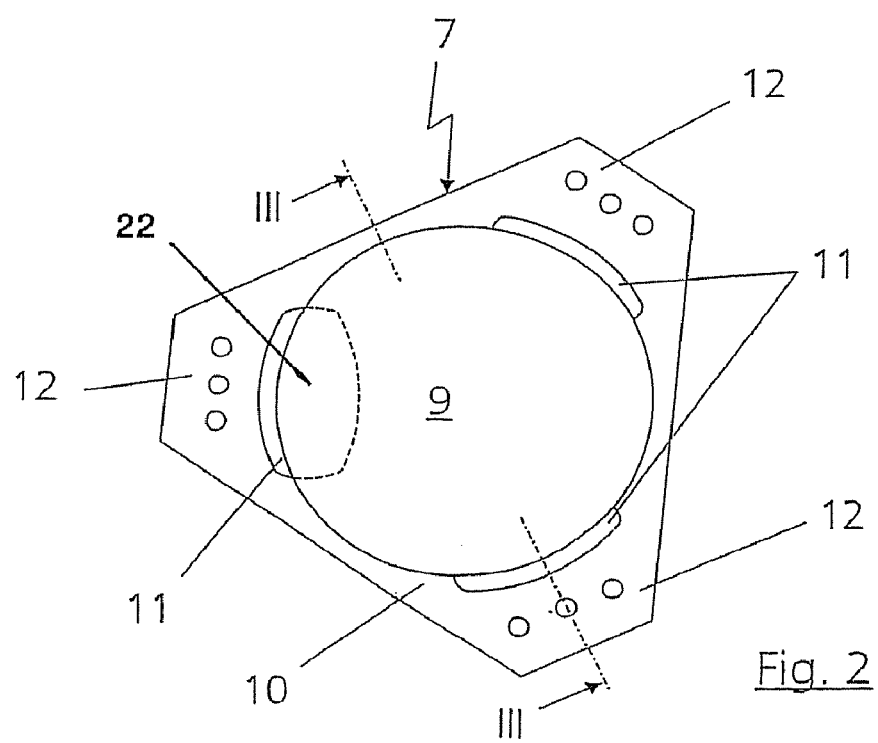
FIG. 2 shows a plan view of an optical subassembly having an optical element which is constructed as a mirror element.
Figure 3:
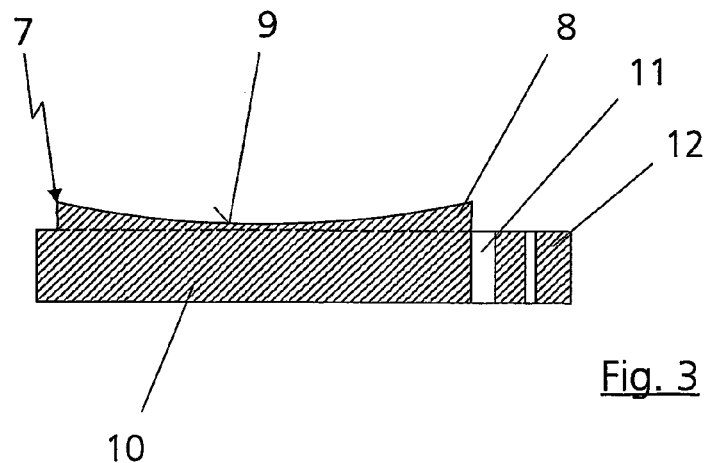
FIG. 3 shows a section along the line III-III in FIG. 2.

The construction of a mirror element 7 is illustrated in principle in FIGS. 2 and 3. As can be seen, the mirror element 7 has an actual mirror part 8 with an optical surface 9 and a base part 10, but which is formed in one piece with the mirror part 8. The materials provided for this are materials which have a very low thermal expansion coefficient, such as quartz, Zerodur® (Schott) or ULE® (Corning).

On the outer circumference of the optical surface 9 of the mirror part 8, at intervals of about 120°, cutouts in the form of curved slots 11 are arranged. The slots 11 correspond in their curved shape to the external course of the optical surface 9 and extend continuously in the axial direction through the base part 10. Here, they are located between three bearing points 12 arranged on the circumference of the base part 10 and the mirror part 8. This means that, between the mirror part 8 with its optical surface 9, there are narrow material regions only on both sides of the slots 11, which produce a connection to bearing points (12).

By means of the slots 11 in the position illustrated, stresses acting from outside of a thermal or mechanical kind can largely be kept away from the optical surface 9, so that no changes in the illumination beam occur.

Figure 4:
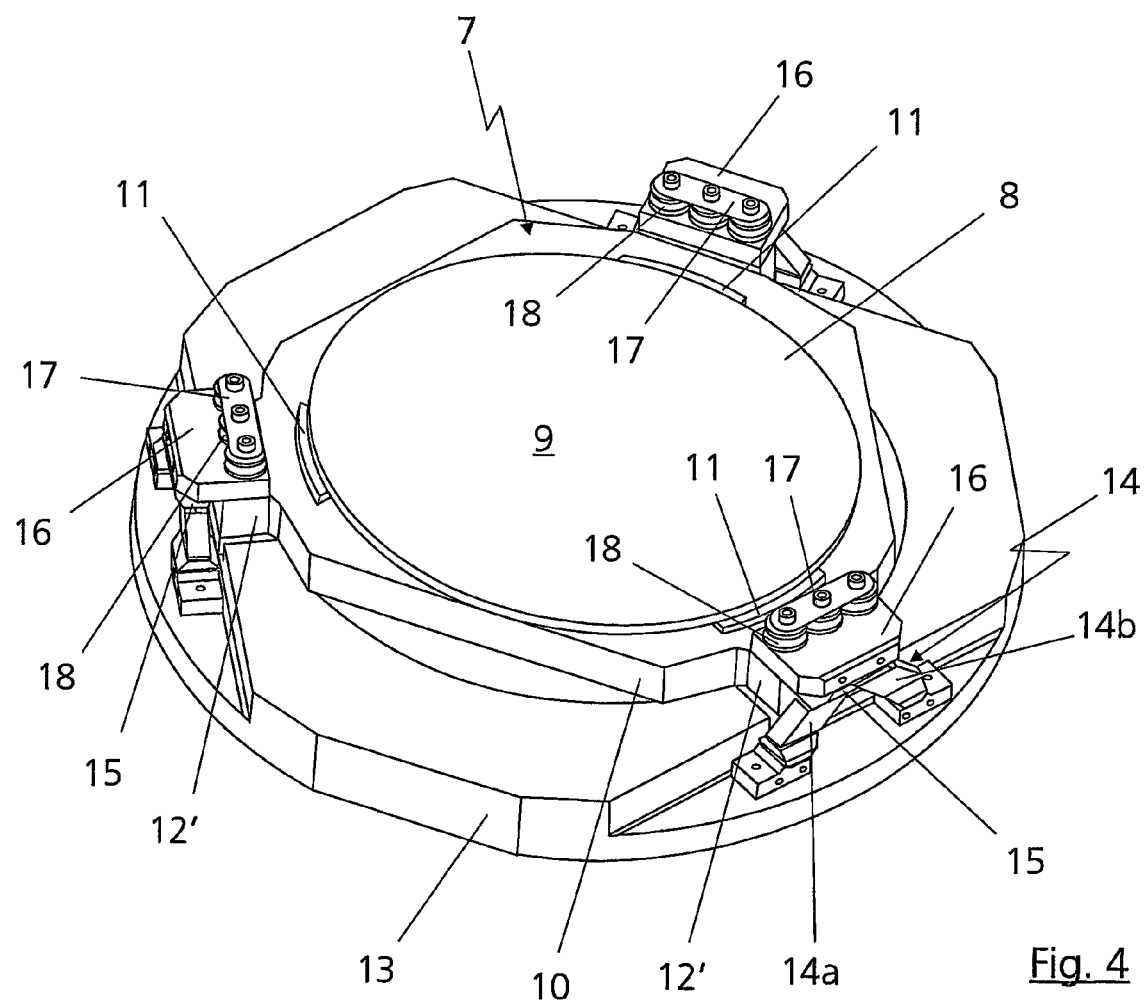
FIG. 4 shows a perspective illustration of the optical element according to the invention with connecting joints and a mount.

As illustrated in principle in FIG. 4, the optical element is connected to a mount 13 via the three bearing points 12 which, in this case, are formed in the form of attachments to the base part 10. At each bearing point 12, as connecting elements two (2 ea.), bearing feet 14 in the form of a bipod are provided, the two legs 14a and 14b of the bipod being connected to the mount 13, while, on the upper side, where the two legs 14a and 14b meet, a retaining plate 15 is provided which, to be connected to the base part 10, comes to rest underneath the latter. In each case a clamping plate 16 is fitted above the base part 10 in the region of the bearing points 12. A screw connection 17 with screws produces the clamping connection between the clamping plate 16 and the retaining plate 15 at each bearing point. In order that reproducible bearing forces are achieved, between the heads of these screws of the screw connection 17 and the clamping plate 16 there are in each case spring elements 18, for example in the form of disk springs, by means of which the precise tightening forces and therefore identical clamping forces can be set.

In FIG. 2, it is indicated by dashed lines that one of the curved slots 11 (illustrated on the left) is of enlarged form. In this way, a larger aperture is created in a region 22 which is optically not relevant, through which, if necessary, an illumination beam for illuminating the wafer can be guided if, on account of constructional conditions, it is necessary that the illumination beam cannot be led past a mirror element 7.

The two bearing feet 14 with their legs 14a and 14b belonging to each bearing point 12 are formed as connecting joints which are designed to be stiff in the tangential direction and in the axial direction, which is generally the optical axis. As can be seen, the bearing feet 14 with their two bearing legs 14a and 14b at each bearing point 12 have six degrees of freedom but—as mentioned—the degrees of freedom being blocked in the tangential direction and in the axial direction or a high stiffness being preselected. In the remaining directions or degrees of freedom, there is a very soft attachment. On account of the arrangement of the connecting joints and the bearing points, in this way the result, viewed overall, is a very high stiffness. However, stresses which occur at each bearing point can be absorbed or dissipated by the latter because of their softness or resilience.

The connecting joints can be designed as solid-body joints. This means that in each case they comprise a bearing block which, in accordance with the desired degrees of freedom in which resilient compliance is to be present, is provided with slots which merely leave free in the bearing block a material cross section such that appropriate bending or resilience is provided at the point with the slots. Solid-body joints of this type are generally known.

For the connecting elements, materials will generally likewise be provided which have a very low thermal conductivity and a very low thermal expansion coefficient. However, it is advantageous if elastic materials, such as Invar or carbon fibers, are used. Ceramic materials with their likewise very low thermal expansion coefficient are suitable for the mount 13. The lower plate 15 can likewise consist of Invar, while for the upper plate 16 any desired material is possible, such as a steel plate, since this has no influence on the mirror element. In order to be able to intercept or dissipate thermal stresses, the bearing feet 14 are very soft, in particular in the radial direction.

We claim:

1. An optical subassembly, comprising: a mount, a mirror element that has an optical surface and bearing points arranged on the circumference of the mirror element, the mirror element being connected to the mount at the bearing points via connecting elements, the mirror element having stress-decoupling cutouts arranged between the optical surface and the bearing points, the mirror element having a mirror part which has the optical surface, the mirror element further having a base part, the cutouts being arranged in the base part such that at least one of the cutouts allows the passage of a projected beam through the mirror element by way of the at least one of the cutouts.

2. The optical subassembly as claimed in claim 1, wherein the cutouts are formed as slots.

3. The optical subassembly as claimed in claim 2 wherein the slots have at least approximately a curved shape.

4. The optical subassembly as claimed in claim 3, wherein, in its course, the curved shape is at least approximately matched to the external course of the optical surface.

5. The optical subassembly as claimed in claim 2, wherein the slots are designed to be continuous in an axial direction.

6. The optical subassembly as claimed in claim 1, wherein the mirror part and the base part are formed in one piece.

7. The optical subassembly as claimed in claim 1, wherein the connecting elements have adjustable clamping forces.

8. The optical subassembly as claimed in claim 7, wherein the connecting elements have clamping elements which connect the bearing points to the mount with a force fit.

9. The optical subassembly as claimed in claim 8, wherein the clamping elements are each connected to the mount by screw connections.

10. The optical subassembly as claimed in claim 9, wherein the screw connections are provided with spring elements, via which a preselected preclamping force can be set.

11. The optical subassembly as claimed in claim 7, wherein three bearing points are arranged distributed on the circumference of the optical element, each bearing point being connected to the mount via at least one connecting joint.

12. The optical subassembly as claimed in claim 11, wherein the at least one connecting joint is designed to be stiff in two directions.

13. The optical subassembly as claimed in claim 12, wherein the at least one connecting joint is designed to be stiff in a tangential direction and in an axial direction.

14. The optical subassembly as claimed in claim 11, wherein two bearing feet are provided for each bearing point as connecting elements.

15. The optical subassembly as claimed in claim 14, wherein the two bearing feet are arranged in the form of a bipod.

16. The optical subassembly as claimed in claim 11, wherein the connecting elements are formed as solid-body joints with slots.

17. The optical subassembly as claimed in claim 1, wherein the beam is an illumination beam.

18. The optical subassembly as claimed in claim 1, wherein the at least one of the cutouts is arranged to allow at least a portion of the beam to pass through a region of the mirror part.

19. A projection objective for use in semiconductor lithography, the projection objective, comprising: at least one optical subassembly with a mirror element which has an optical surface and bearing points arranged on the circumference of the mirror element, the mirror element being connected to a mount through the bearing points via connecting elements, the mirror element having stress-decoupling cutouts arranged between the optical surface and the bearing points so as to permit a beam to pass through the mirror element by way of at least one of the cutouts.

20. The projection objective as claimed in claim 19, wherein the cutouts are at least approximately formed as curved slots.

21. The projection objective as claimed in claim 19, wherein the mirror element has a mirror part with the optical surface and a base part, the mirror part and the base part being formed in one piece.

22. The projection objective as claimed in claim 19, wherein the connecting elements have clamping elements which connect the bearing points to the mount with a force fit.

23. The projection objective as claimed in claim 22, wherein the clamping elements are connected to the mount via screw connections with spring elements, via which a preselected preclamping force can be set.

24. The projection objective as claimed in claim 19, wherein at least the mirror element, the connecting elements and the mount are formed of materials with very low thermal expansion coefficients.

25. The projection objective as claimed in claim 24, wherein the mirror element comprising a mirror part with the optical surface and a base part connected to the latter in one piece is formed of glass ceramic.

26. The projection objective as claimed in claim 24, wherein at least some of the connecting elements are formed of Invar.

27. The projection objective as claimed in claim 24, wherein the mount is formed of ceramic.

28. The projection objective as claimed in claim 19, wherein the beam is an illumination beam.

29. The projection objective as claimed in claim 19 wherein at least one of the cutouts is arranged to permit at least a portion of the beam to pass through a region of the mirror part.

* * * * *